United States Patent [19]
Yen

[11] Patent Number: 5,911,108
[45] Date of Patent: *Jun. 8, 1999

[54] METHOD FOR PROTECTING AN ALIGNMENT MARK ON A SEMICONDUCTOR SUBSTRATE DURING CHEMICAL MECHANICAL POLISHING AND THE RESULTING STRUCTURE

[75] Inventor: Chu-Tsao Yen, Fremont, Calif.

[73] Assignee: Integrated Device Technology, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/791,064

[22] Filed: Jan. 29, 1997

[51] Int. Cl.[6] .................................................. H01L 21/76
[52] U.S. Cl. .................................................. 438/401
[58] Field of Search .................................. 438/788, 401, 438/662, 633

[56] References Cited

U.S. PATENT DOCUMENTS

| | | | |
|---|---|---|---|
| 5,100,834 | 3/1992 | Mukai | 438/662 |
| 5,401,691 | 3/1995 | Caldwell | 437/228 |
| 5,640,056 | 6/1997 | Caldwell | 257/797 |
| 5,705,320 | 1/1998 | Hsu et al. | 430/5 |

*Primary Examiner*—Charles Bowers
*Assistant Examiner*—Craig Thompson
*Attorney, Agent, or Firm*—Skjerven, Morrill, MacPherson, Franklin & Friel

[57] ABSTRACT

A method for maintaining an alignment mark on a semiconductor substrate includes formation of an opening called a "protective window," that is sufficiently deep to ensure that an alignment mark formed at the bottom of the preventive window remains intact during planarization, e.g. by chemical mechanical polishing. Prior to planarization, the protective window has a height that is larger than a predetermined distance known to be sufficient to protect the alignment mark. The protective window is created by etching away one or more layers, such as a layer of metal and a layer of polysilicon simultaneously with etching steps normally required to create patterns for electronic devices on the substrate. Such creation of a protective window prior to planarization eliminates the need for masking and etching steps conventionally used after planarization to recover an alignment mark.

15 Claims, 11 Drawing Sheets

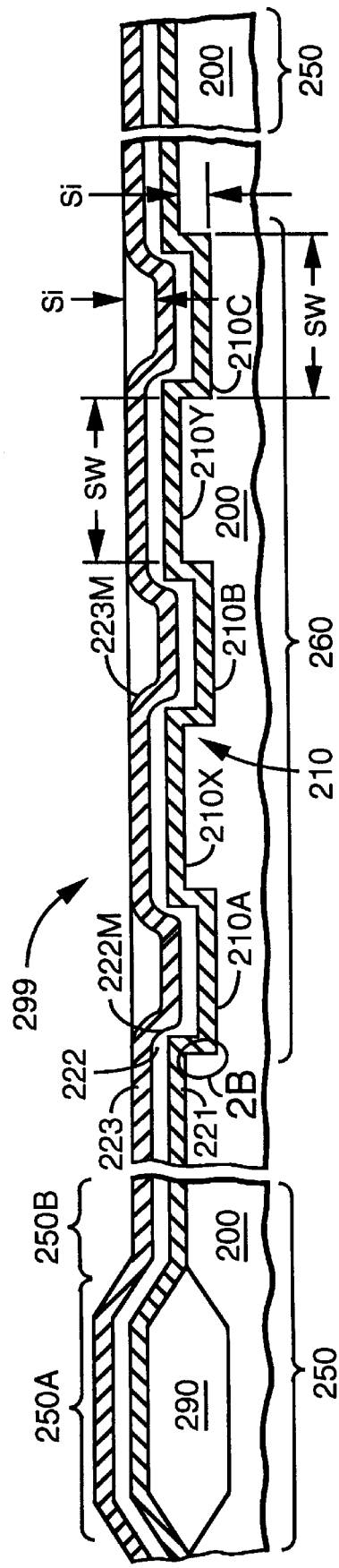
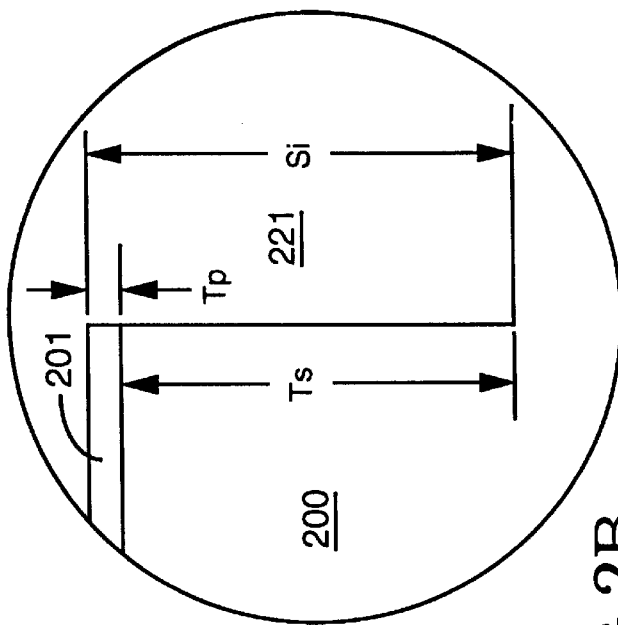
FIG.2A
FIG.2B

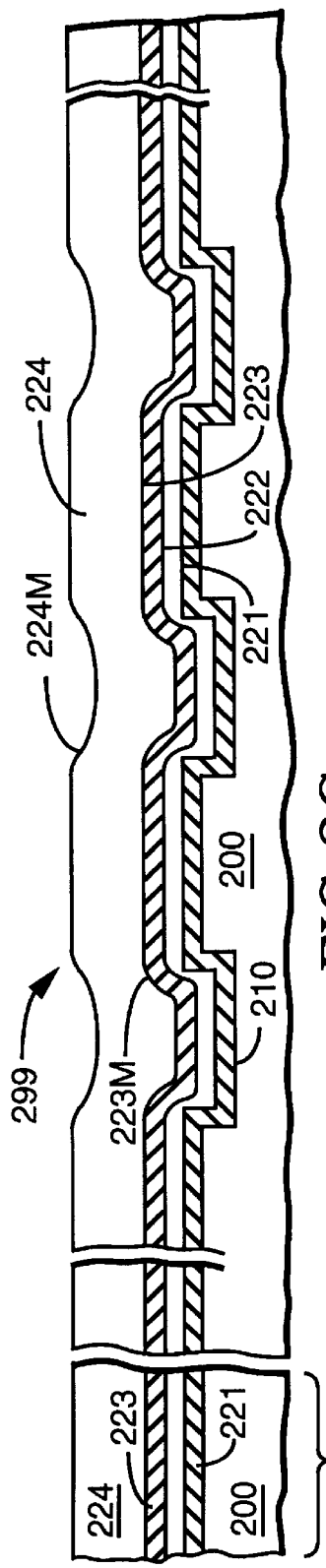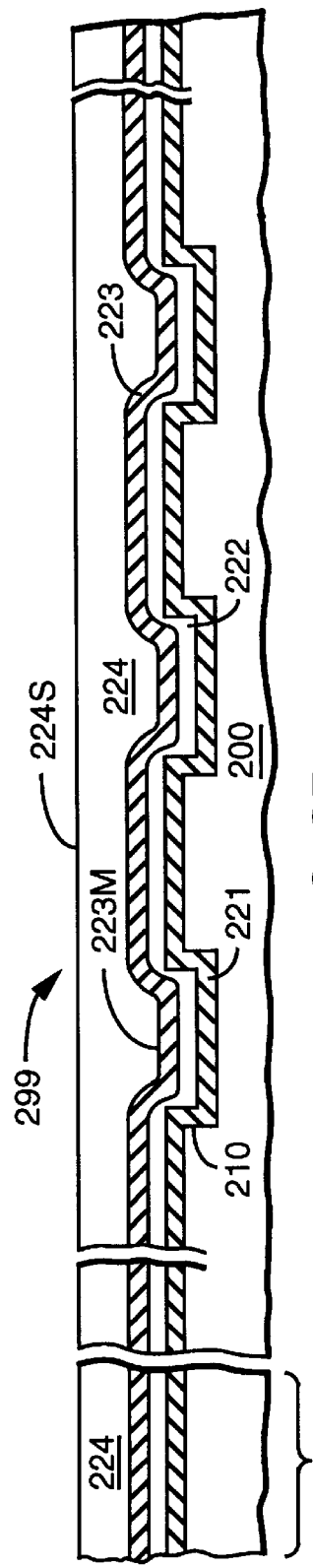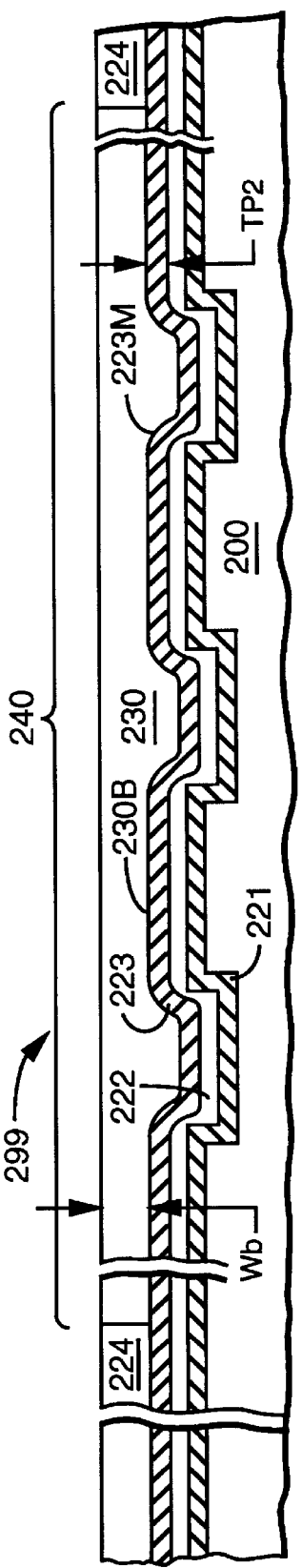

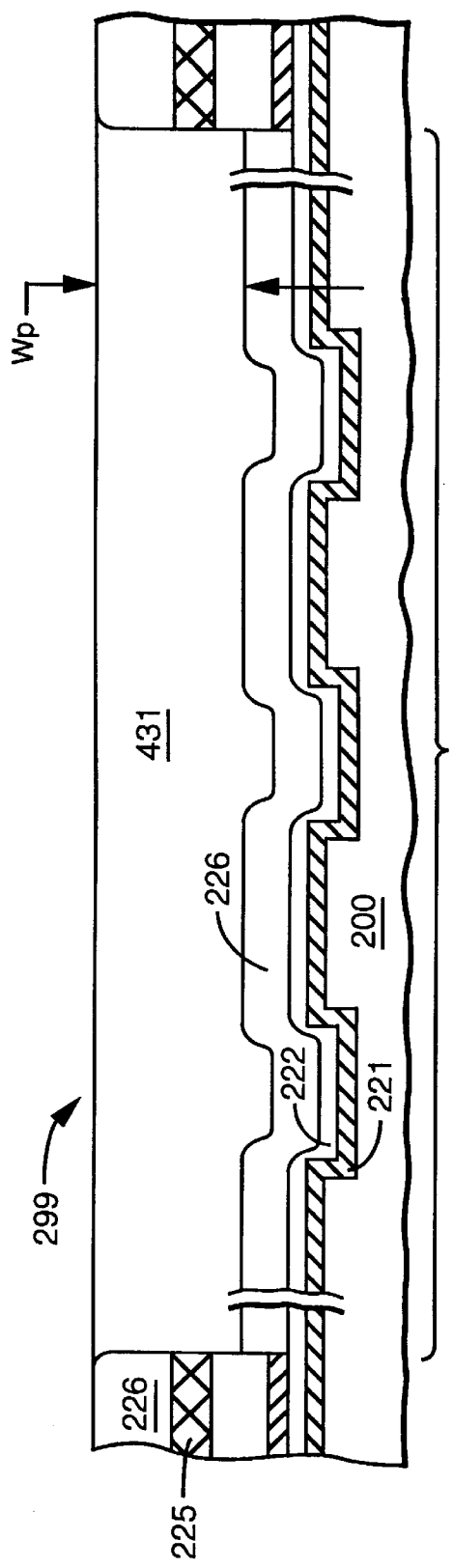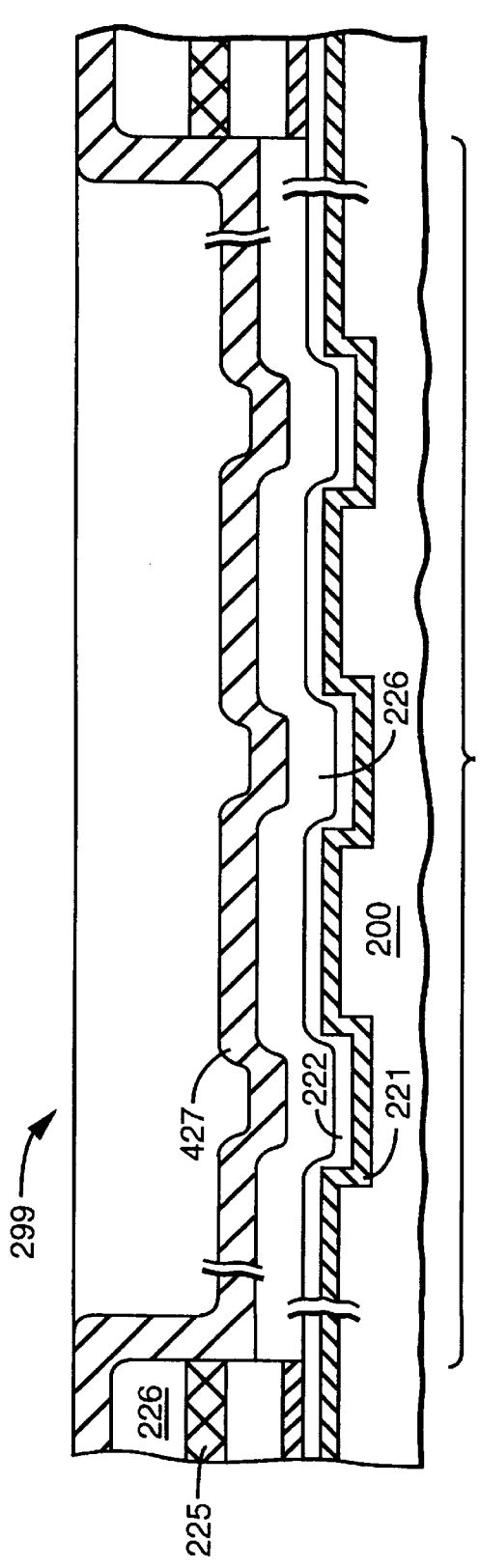
FIG. 4A
FIG. 4B

METHOD FOR PROTECTING AN ALIGNMENT MARK ON A SEMICONDUCTOR SUBSTRATE DURING CHEMICAL MECHANICAL POLISHING AND THE RESULTING STRUCTURE

FIELD OF THE INVENTION

The present invention relates to the processing of a semiconductor substrate during the fabrication of integrated circuit die, and in particular to a method for protecting an alignment mark on a semiconductor substrate during planarization, for example, by chemical mechanical polishing.

BACKGROUND OF THE INVENTION

Conventional integrated circuit dice 101A–101N (a total of N dice) included in semiconductor substrate 100 (see FIG. 1A) are fabricated by forming patterns (not shown) in conductive and insulative layers (e.g. layer 130 in FIG. 1D). Depending on the complexity of the fabrication process, the number of such layers can range from ten to more than thirty. During the fabrication process, a pattern in a layer (e.g. layer 130) being formed is aligned to a pattern in a previously formed layer, to ensure isolation or interconnection (as appropriate) of various parts of electronic devices (not shown) being formed in dice 101A–101N.

Alignment between patterns in different layers is typically performed in a tool called a "stepper". The stepper aligns patterns by use of a laser beam (not shown) to sense the position of two alignment marks 121I (FIG. 1A) and 121J formed in substrate 100. Alignment marks 121I and 121J (only one mark 121J is illustrated in FIG. 1B) are formed at the bottom of corresponding openings (known as "windows") 120I and 120J in fields 102I and 102J. Fields 102I and 102J are portions of substrate 100 that are skipped by the stepper while forming patterns for electronic devices in certain areas, called "active areas" that correspond to dice 101A–101N and that are formed in most of the area of substrate 100.

Alignment marks 121I and 121J typically include a number of stripes, formed at the bottom of a window. For example, alignment mark 121J (FIG. 1C) includes a number of low stripes 121A–121D, and a number of high stripes 121X–121Z interleaved between low stripes 121A–121D. The dimensions and geometry of alignment marks 121I, 121J depend on the specific model of the stepper being used. For example, a stepper ASM 2500/40 available from ASM Lithography, Veldhoven, The Netherlands, requires the stripe height Sh to be approximately 1.2 KÅ±0.4 KÅ to ensure proper detection of alignment marks. In this example, stripes 121A–121D and 121X–121Z are formed by etching to a depth (equal to a stripe's height) Sh, for example 1.5 KÅ, into substrate 100. Stripes 121X–121Z have a width Sw of, for example, 8 $\mu$m (80 KÅ), and are horizontally separated from each other by the same width Sw. Window 120J has an area (called "window area") of, for example, 1 mm×1 mm and a depth Wd, for example in the range of 5–10 KÅ (estimated depth). Therefore an upper surface 100U of substrate 100 is separated from a bottom surface 100B by depth Wd.

Although only three high stripes 121X–121Z (and four low stripes 121A–121D) are illustrated in FIGS. 1C–1F, typically there are several groups of such high stripes (e.g. four groups) in an alignment mark. Stripes in a group are typically identical to each other, but may have different dimensions and orientation from stripes in another group.

After creation, if an alignment mark 121J is buried, for example, underneath oxide layer 130 (FIG. 1D), another alignment mark 131J is typically formed on oxide layer 130 by replication of buried alignment mark 121J. However global planarization, such as chemical mechanical polishing, can destroy the replicated alignment mark 131J. For example, if oxide layer 130 is globally planarized, alignment mark 131J (FIG. 1D) on exposed surface 130E of oxide layer 130 is destroyed, because a polished surface 130S (FIG. 1E) of substrate 100 becomes substantially flat, devoid of alignment mark 131J. Such loss of alignment marks 131I (not shown) and 131J (FIG. 1D) limits the number of layers that can be formed after chemical mechanical polishing, unless a buried alignment mark (e.g. alignment mark 121J) underneath oxide layer 130 is recovered. Buried alignment marks are usually recovered by a separate step, for example by etching oxide layer 130 (FIG. 1F) in window area 130W (FIG. 1E) bounded by window 120J.

U.S. Pat. No. 5,401,691 by Caldwell that is incorporated by reference herein in its entirety describes a method in which a "first insulating layer is . . . chemically-mechanically polished so that the alignment mark is not replicated" (col. 3, lines 64–66) and also a "second insulating layer is . . . chemically-mechanically planarized such that the alignment mark is not replicated . . . " (col. 4, lines 15–18). Caldwell requires repeated recovery of alignment marks that are lost during planarization. Specifically, Caldwell requires "contact etch [that] uncovers and recaptures alignment mark 310 formed in polysilicon layer 320" (col. 9, lines 3–7). Caldwell also teaches that after "alignment mark 310 is replicated in metal 1 layer 332" (col. 9, lines 26–27), "[d]uring via etch, ILD [inter-layer-dielectric] 336 over alignment mark area 308 is simultaneously etched to recover and reveal alignment mark 310 formed in metal layer 332" (col. 10, lines 14–17).

Caldwell also requires processing (e.g. etching of polysilicon layer and etching of metal layer) in a "dropout area" "[s]urrounding and directly adjacent" to an alignment mark (col. 3, lines 51–53). For example, Caldwell states that "[b]y removing layers . . . from dropout area 306, the surface topography of dropout area 306 is consistently below the topography of other substrate areas during processing" (col. 10, lines 48–52).

SUMMARY OF THE INVENTION

In accordance with this invention, an alignment mark (also called simply "mark") is located at the bottom of an opening or hole (hereinafter "protective window") in layers on a semiconductor substrate. The protective window is deliberately made sufficiently deep to protect the mark, e.g. to prevent destruction of the mark during planarization. Specifically, the protective window is created prior to planarization, and has an initial depth chosen to be larger than or at least equal to the sum of (1) a thickness to be reduced during planarization, and (2) a predetermined distance (hereinafter "critical distance") needed to ensure that the mark remains unaffected during planarization.

In one embodiment, the critical distance (below which a mark begins to be destroyed) is determined empirically by planarizing a sample substrate (having a window and a mark at the bottom of the window) while intermittently measuring the mark's height and the window's depth. During an initial phase of planarization, the mark's height remains unchanged while the window's depth reduces. After the initial phase, the window's depth falls below the critical distance and the mark's height begins reducing. The empirically determined critical distance is then used to create a protective window of the appropriate depth as discussed below.

In one embodiment of a method (hereinafter "double CMP" method), a first layer (e.g. a layer of polysilicon material, commonly known as "polysilicon 2 layer") is formed over a previously-formed layer (hereinafter "base layer", e.g. a layer of oxide) having at least one alignment mark (hereinafter "base mark") which may be formed by replication of an underlying alignment mark. The first layer is formed in areas (hereinafter "active areas") in which integrated circuit dice are formed in the semiconductor substrate. The first layer is also formed in an area (hereinafter "window area") that contains the base mark such that a first replicated mark is formed on an exposed surface of the first layer by replication of the base mark.

In this embodiment, a second layer, such as an insulative layer (e.g. a layer of oxide), is formed over the first layer in all areas, i.e. in the window area as well as in the active areas. Therefore, in this embodiment, the first layer is kept intact in all areas of the semiconductor substrate, and the second layer is formed in contact with the first layer in all the areas. A second replicated mark is created on the exposed surface of the second layer by replication of the first replicated mark.

Next, the second layer is globally planarized, for example by chemical-mechanical polishing. After global planarization of the second layer (i.e. after the first planarization step), the second replicated mark is destroyed and the semiconductor substrate has a polished surface that is flat across all areas. An opening or hole (hereinafter "base window") is then formed by removing a portion of the second layer in the window area, thereby to expose the first replicated mark at the bottom of the base window. The base window is created simultaneously with a step required for processing active areas, for example a step (called "contact etching step") of forming via holes in the second layer to expose the underlying first layer.

Then, a third layer, such as a conductive layer (e.g. a layer of metal, commonly known as "metal 1 layer") is formed over the exposed first layer in the window area, and over the second layer in the active areas. Thereafter, a protective window is created, in this embodiment by deepening the base window, for example by removing (1) the third layer in the window area and also (2) the first layer in the window area, thereby to expose the base layer and the base mark formed on the base layer.

As noted above, the protective window has an initial depth chosen to be sufficiently larger than the above-described critical distance, so that after planarization the base mark's upper surface is still separated by at least the critical distance from the uppermost surface (hereinafter "planarized surface") of the substrate. In this embodiment, the protective window has approximately the same area as the base window, but is deeper than the base window by an amount equal to a sum of (1) the thickness of the third layer and (2) the thickness of the first layer. Hence a protective window in accordance with the invention is formed in the window area before a second planarization step, e.g. simultaneously with any step that is needed to form electronic devices in the active areas, such as a step of etching the third layer.

Thereafter a fourth layer, such as a dielectric layer (e.g. a layer of oxide, hereinafter "metal-metal dielectric layer") is formed over the third layer in all areas. Next the fourth layer is planarized for example by chemical mechanical polishing. Planarization of the fourth layer occurs only in the active areas and not in the window area because the surface at the bottom of the protective window is too far away (at a distance greater than the critical distance) to be planarized. Hence, at the end of the second planarization step, a portion of the fourth layer in the protective window remains untouched, although all areas of the semiconductor substrate other than the window area are planarized. Therefore, at the end of planarization of the fourth layer, a fourth replicated mark on the fourth layer remains intact due to protection by the protective window in one embodiment of the invention.

Formation of a protective window simultaneously with steps required for fabrication of integrated circuit dice prior to the second planarization step as described above eliminates the conventional steps of masking and etching after the second planarization step required to recover an alignment mark. Elimination of such conventional steps can speed up fabrication of integrated circuit dice and reduce cost as compared to conventional methods. Moreover as only a protective window is used to protect an alignment mark, this invention also eliminates processing in the above-described "dropout areas" around an alignment mark as required by Caldwell in the above-referenced U.S. Pat. No. 5,401,691.

BRIEF DESCRIPTION OF THE DRAWINGS

FIG. 2A illustrates, in a cross-sectional view, an alignment mark 260 and active areas 250 in a body (including semiconductor substrate 200) in accordance with the invention.

FIG. 2B illustrates, in an enlarged view, a portion 2B of the body of FIG. 2A.

FIGS. 2C–2J illustrate in cross-sectional views of the body during various steps in formation of integrated circuit dice while protecting the alignment mark during planarization.

FIGS. 4A–4D illustrate in cross-sectional views additional steps for processing a body that is planarized three times.

DETAILED DESCRIPTION

According to principles of the invention, an alignment mark (also called simply "mark") is preferably maintained at least at a critical distance from an uppermost surface of a body (e.g. formed of a semiconductor substrate and one or more layers on the substrate), at the bottom of an opening (also called "protective window") in the body, thereby to prevent destruction of the mark during planarization (e.g. by chemical mechanical polishing). The protective window is created (as described below) by one or more steps that are also used in formation of integrated circuit dice, thereby eliminating one or more additional steps that may be conventionally required for recovering alignment marks after planarization. The protective window can be formed by deepening a previously formed base window (that surrounds an alignment mark) after formation of one or more layers but prior to planarization that would otherwise destroy the alignment mark.

Figure 2F:
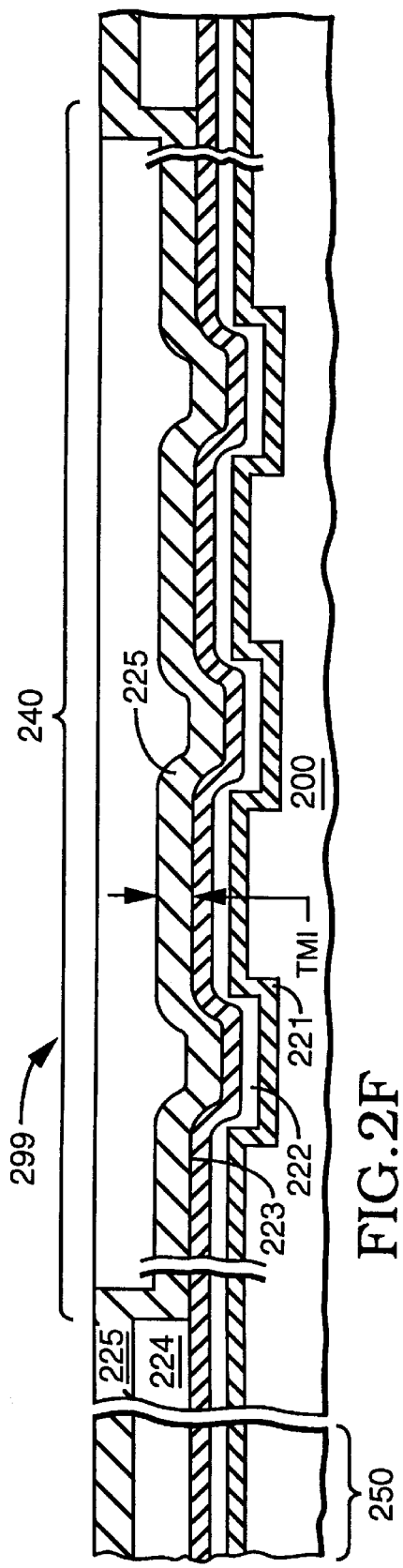
Figure 2G:
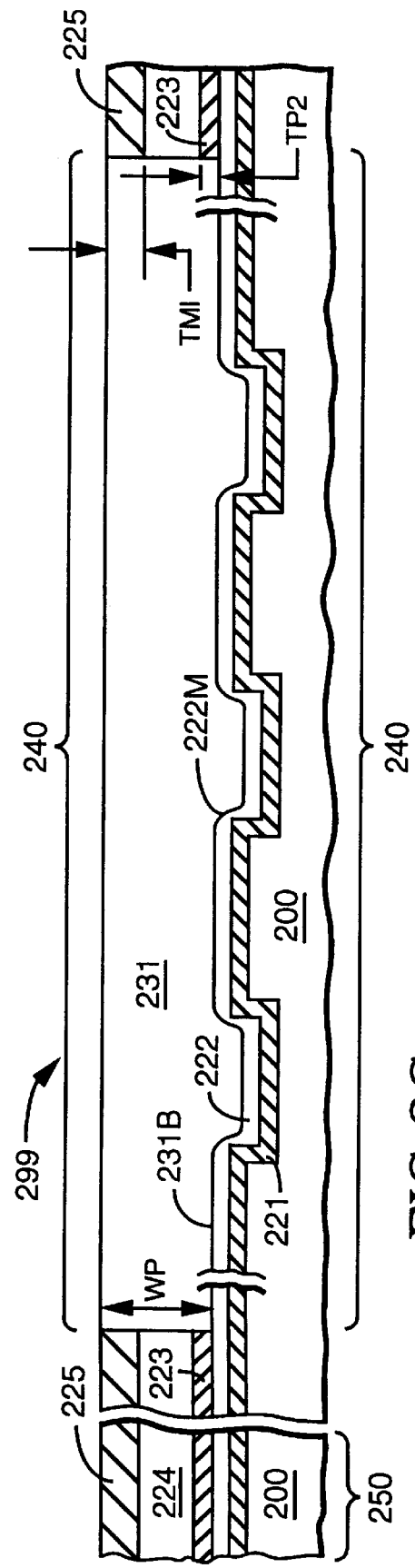

In one embodiment, a protective window protects an alignment mark during fabrication of a body having two polysilicon layers and two metal layers by a process (hereinafter "double CMP" process) requiring two steps of chemical mechanical polishing. In this embodiment, a layer (hereinafter "protective layer") 201 (see the enlarged cross-sectional view of body 299 that is formed of substrate 200 and layer 201 in FIG. 2B) is formed over the entire surface of a semiconductor substrate 200 (e.g. a silicon wafer). For clarity, protective layer 201 is not shown in the cross-sectional view of body 299 in FIG. 2A. Protective layer 201 has a thickness Tp of, for example, 0.3 KÅ and is formed, for example, by thermally growing a layer of oxide during a high temperature cycle, such as a denuded oxidation step.

Semiconductor substrate 200 includes one or more marking areas such as marking area 260 in which an alignment mark, e.g. alignment mark 210 (also called "original mark") is initially generated in body 299 (not all marking areas are shown in FIG. 2A). Alignment mark 210 is generated, for example, by (1) applying a photosensitive material (not shown), (2) masking and developing the applied photosensitive material, (3) etching away selected portions of protective layer 201 and semiconductor substrate 200 (e.g. to form stripes 210A–210C), (4) by stripping the remaining photosensitive material, and (5) removing protective layer 201. Although specific steps are listed in this example, other semiconductor processing steps can also be used, as described in, for example, the above-referenced U.S. Pat. No. 5,401,691. For clarity, steps well known in the art of formation of integrated circuit dice are not described in detail herein. Such steps and other similar steps for implementing various embodiments of the invention will be obvious to a person skilled in semiconductor processing in view of the disclosure.

In the embodiment illustrated in FIGS. 2A–2J, in addition to the above-discussed marking areas, semiconductor substrate 200 has certain areas called "active areas", e.g. areas 250 (for convenience, a single reference numeral 250 is used to designate more than one active area). Active areas 250 are areas of semiconductor substrate 200 in which integrated circuit dice having electronic devices are formed. Active areas 250 include (1) one or more isolation regions 250A in which an insulation layer, e.g. a field oxide layer 290 (described below) is formed, and (2) one or more island regions 250B in which an insulation layer is not formed.

In this embodiment, an insulation layer is fabricated (after formation of stripes 210A–210C) by: (1) growing a protective thermal oxide layer (not shown; e.g. of thickness around 0.2 KÅ), (2) blanket depositing a nitride layer (also not shown; e.g. of thickness around 1.5 KÅ) by chemical vapor deposition, (3) applying a photoresist material (also not shown) and masking and developing the photoresist material in all areas except marking areas (e.g. area 260), (4) etching the oxide and nitride layers (not shown; also called "stack") to expose the underlying silicon substrate in active areas 250, (5) removing the photoresist material (not shown), (6) growing a field oxide layer 290 (e.g. of thickness 4 KÅ or thickness 7 KÅ) in active areas 250 and (7) removing the nitride layer (not shown). Note that in this example, field oxide layer 290 does not grow in marking areas (e.g. area 260) and island regions (e.g. region 250B) due to protection by the nitride layer.

Although FIG. 2A illustrates three low stripes 210A–210C and two high stripes 210X–210Y (formed between low stripes 210A–210C), any number of such low and high stripes can be included in alignment mark 210. Each stripe (e.g. high stripe 210Y) is vertically separated from an adjacent stripe (e.g. low stripe 210C) by a distance, called initial stripe height Si. A minimum stripe height Smin is the smallest stripe height required by a predetermined stepper to recognize alignment mark 210.

For example, in one embodiment, the above-described process, to be properly controlled, requires a minimum stripe height Smin of 0.8 KÅ, and maximum stripe height Smax of 1.6 KÅ. Therefore, in one embodiment, alignment mark 210 has an initial stripe height Si (FIG. 2B) in the range of 0.8–1.6 KÅ, preferably 1.2 KÅ. Alignment mark 210 has a stripe width Sw (FIG. 2A). Stripe width Sw can be, for example, 8 μm or 8.8 μm, wherein one of the groups has stripes of width 8.0 μm and another of the groups has stripes of width 8.8 μm. Stripe width Sw is not a critical aspect of the invention.

Thereafter, a number of layers 221–223 (FIG. 2A) are formed on semiconductor substrate 200. Specifically, a layer 221 (also referred to as "polysilicon 1 layer") of polysilicon material is formed (e.g. by blanket deposition) in all areas of semiconductor substrate 200. In one embodiment, polysilicon 1 layer 221 has a stack of patterns that are formed of polysilicon and silicide materials. Then, an insulative layer (e.g. a layer of silicon dioxide) 222 is formed, for example by chemical vapor deposition onto polysilicon 1 layer 221. During the deposition step, an alignment mark (also called "base mark") 222M is generated on insulative layer 222 by replication of original mark 210 in layers 221 and 222.

Thereafter, insulative layer 222 is thermally annealed, followed by opening of via holes (not shown) to expose polysilicon 1 layer 221. Then, another layer (hereinafter "polysilicon 2 layer", also referred to as "first layer") 223 of polysilicon material is formed on insulative layer 222. Polysilicon 2 layer 223 also has an alignment mark (also called "first replicated mark") 223M formed by replication of the underlying base mark 222M.

Next, an insulative layer 224 (also referred to as "second layer" e.g. a stack of undoped oxide and doped (e.g. with boron and phosphorus) oxide, with thermal reflow of doped oxide (or alternatively just a layer of purely undoped oxide) is formed over the entire surface of layer 223 (FIG. 2C). Insulative layer 224 has a thickness (combined thickness if layer 224 is a stack) for example, in the range 15–18 KÅ. An alignment mark (also called "second replicated mark") 224M is also generated on insulative layer 224.

Thereafter, in a planarization step, insulative layer 224 is planarized all over semiconductor substrate 200 (e.g. by chemical mechanical polishing using a pad and slurry). During the planarization step, second replicated mark 224M is destroyed, and a flat surface (hereinafter "planarized surface") 224S (FIG. 2D) is formed over the entire body 299.

Then, a hole (hereinafter "base window") 230 is formed by removing (e.g. by pattern etching using a mask) insulative layer 224 in a window area 240 (FIG. 2E). In this embodiment, base window 230 is a square hole of area 1 mm×1 mm, and is centered over first replicated mark 223M. Base window 230 has a depth Wb which is equal to the thickness of layer 224 after planarization, for example, in the range 12–15 KÅ. So, after formation of base window 230, first replicated mark 223M becomes exposed at bottom surface 230B of base window 230. Base window 230 is created simultaneously with a step (also called "contact etching step") of forming via holes (not shown) in insulative layer 224 in active areas 250 to allow contact of polysilicon 2 layer 223, polysilicon 1 layer 221 and silicon substrate 200 with a to-be-formed conductive layer (described below). During the contact etching step, insulative layer 224 is removed completely from window area 240 so that in this embodiment no insulation material remains on polysilicon 2 layer 223.

Next, a conductive layer (hereinafter "metal 1 layer") 225 (FIG. 2F) is formed over polysilicon 2 layer 223 in window area 240, and over insulative layer 224 in active areas 250. Then, a protective window 231 (FIG. 2G) is formed in body 229 around an alignment mark. In this embodiment, protective window 231 is formed by deepening base window 230, for example, by removing from window area 240 (FIG. 2F) metal 1 layer 225 and polysilicon 2 layer 223. As described later, such deepening of base window 230 is a critical aspect of this embodiment.

Next, an insulative layer (e.g. an oxide layer, also referred to as a "fourth layer") 226 (FIG. 2H) having an initial thickness Ti (e.g. 22 KÅ) is formed in all areas of body 299. Specifically, insulative layer 226 is formed in contact with metal 1 layer 225 in active areas 250 (FIG. 2G) and also formed in contact with insulative layer 222 in window area 240. Insulative layer 226 (FIG. 2H) has a fourth replicated mark 226M formed by replication of base mark 222M. Fourth replicated mark 226M is located at a depth Wp measured perpendicular to an exposed surface 226S of insulative layer 226 in active areas 250.

Then, insulative layer 226 is planarized (FIG. 2I) so that planarized surface 226P defines a plane P which is separated vertically by a distance Wd from an uppermost surface of alignment mark 226M. In this embodiment, insulative layer 226 is planarized only in active areas 250 to remove a thickness Tr (FIG. 2H), e.g. 12 KÅ, of insulation layer 226, for example by chemical-mechanical polishing. In this embodiment, a portion of insulative layer 226 in window area 240 (FIG. 2I) remains untouched, and fourth replicated mark 226M remains intact (e.g. untouched) after polishing. Therefore, after polishing, insulative layer 226 has an original thickness Ti in window area 240 and a final thickness Tf=Ti−Tr (FIGS. 2H–2I) in active areas 250.

The above-described deepening of base window 230 (FIGS. 2F–2G) prior to deposition and planarization of insulative layer 226 protects replicated mark 226M that would otherwise have been destroyed during the planarization step, thereby necessitating conventional recovery steps after planarization.

Figure 2H:
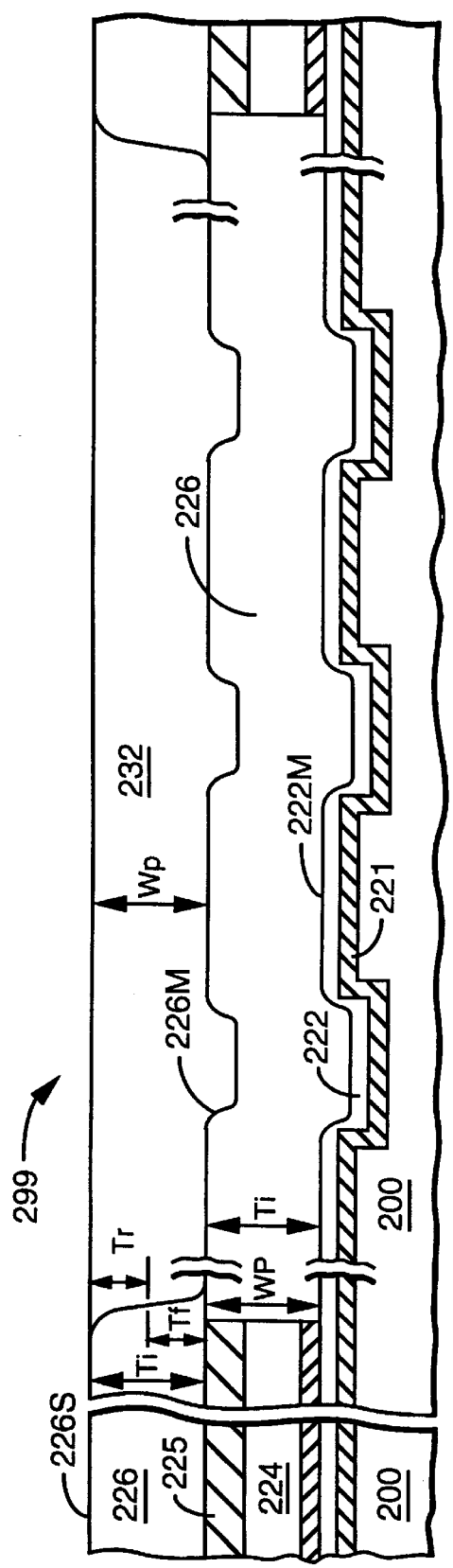
Figure 2I:
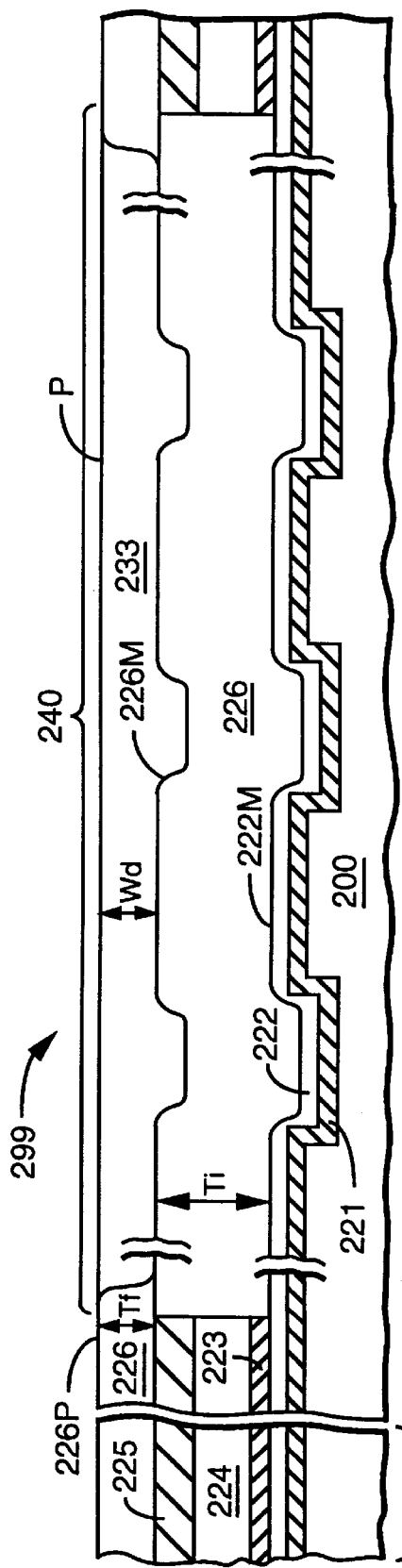

Therefore, in this embodiment, base mark 222M is exposed at bottom surface 231B (FIG. 2G) of protective window 231 prior to deposition and planarization of insulative layer 226. Protective window 231 has a predetermined window depth Wp (e.g. in the range 23–25 KÅ) that is deliberately selected, to be larger than the sum of a thickness Tr (e.g. 12 KÅ; FIG. 2H) to be removed during planarization and a predetermined distance, called critical distance Cd (e.g. 10 KÅ for stripe height of 1.2 KÅ), thereby to ensure that replicated mark 226M remains untouched during planarization. Etching of metal 1 layer 225 and polysilicon 2 layer 223 in window area 240 (FIG. 2G) is performed simultaneously with etching of metal 1 layer 225 in active areas 250 to form patterns for electronic devices in semiconductor substrate 200. So the simultaneous etching in window area 240 to form protective window 231 eliminates the need for an additional step.

The depth Wp of protective window 231 (FIG. 2G) is greater than a depth Wb (FIG. 2E) of base window 230 by an amount equal to the sum of a thickness TP2 (FIG. 2G) of polysilicon 2 layer 223 and a thickness TM1 of metal 1 layer 225. That is, Wp=Wb+TP2+TM1>Tr+Cd. Such deepening of a window (e.g. base window 230) prior to planarization is not required if the window already has a depth greater than or equal to Tr+Cd, i.e. if base window 230 is already a protective window. However, a base window 230 is typically not of depth Tr+Cd because the underlying structure of substrate 200 is too shallow (i.e. because substrate 200 lacks sufficient depth to form such a deep base window 230). Therefore in this embodiment, base window 230 is deepened as described above, after the formation of layers 223, 224 and 225 but prior to the formation of layer 226 and planarization.

Figure 2J:
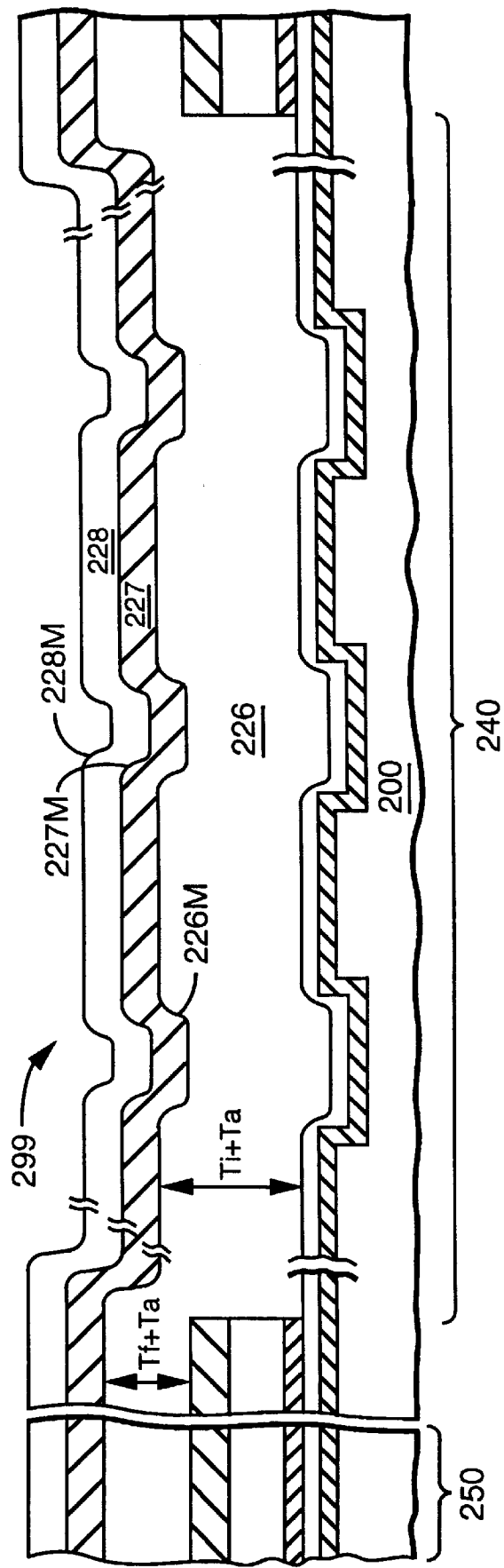

Next, after planarization, an additional insulation material (e.g. oxide) is deposited all over semiconductor substrate 200, thereby to increase the thickness of insulative layer 226 by an additional thickness Ta (FIG. 2J). At this time, insulative layer 226 has a total thickness of Tf+Ta (e.g. a total of 15 KÅ) in active areas 250, and has a thickness Ti+Ta (e.g. 27 KÅ) in window area 240. Alignment mark 226M continues to be replicated in insulative layer 226, and the protective window 232 (FIG. 2H) continues to have a depth Wd=Wp−Tr during the step of depositing additional insulation material.

Then, in a masking and etch step, holes (not shown; also called "metal vias") are formed in insulative layer 226, in a manner known to the skilled artisan in view of the disclosure. Next, a conductive layer (hereinafter "metal 2 layer") 227 (FIG. 2J) is formed in all areas of semiconductor substrate 200, for example by deposition and etching. Metal 2 layer 227 contacts metal 1 layer 225 through the above-described metal vias (not shown). Alignment mark 227M is replicated in metal 2 layer 227. Then, a layer e.g. of oxide and nitride (hereinafter "protective layer") 228 is formed, for example, by deposition, followed by etching to open bond pads (not shown).

Critical distance Cd discussed above is predetermined, e.g. empirically, and depends on a number of parameters specific to the chemical mechanical polishing apparatus (not shown) used in the planarization step. For a Westech polisher (not shown; well known in the polishing art), critical distance Cd can be determined by looking up empirical data plotted in FIG. 3 as follows.

Figure 3:
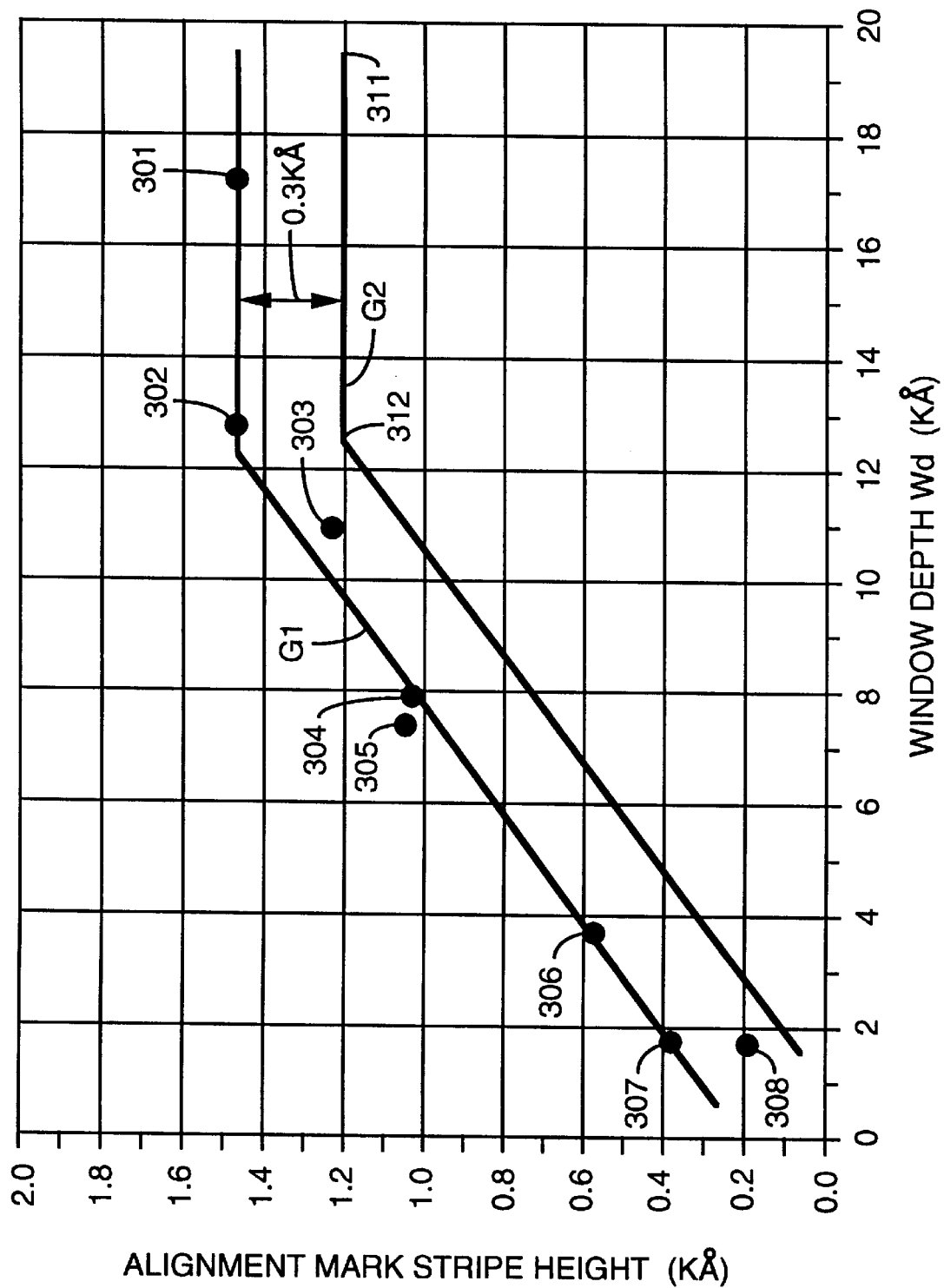
FIG. 3 illustrates, in a graph, a relation between alignment mark's stripe height and a window's depth after planarization.

In one particular embodiment, a sample substrate (not shown) having an alignment mark with an initial stripe height Si of 1.5 KÅ (including a 0.3 KÅ thick protective layer and a 1.2 KÅ thick silicon layer) inside a window (of depth 17 KÅ) is planarized by chemical mechanical polishing using the same above-described Westech polisher, and measurements of stripe height and window depth at several points during planarization are used to plot graph G1 (FIG. 3). The sample substrate is prepared for planarization by forming an alignment mark as described above except that the protective layer of oxide (0.3 KÅ thick) is not removed. Next, a 17 KÅ thick layer of oxide is formed, and partially etched to 15 KÅ.

Then, the sample substrate is planarized to generate a curve G1 in the graph of FIG. 3, which plots the height of the alignment stripes as a function of the window depth Wd during planarization. The sample points 301–308 plotted as graph G1 show the relationship between the stripe height and the window depth. During an initial stage of planarization (e.g. between sample points 301 and 302), the alignment mark is untouched (i.e. stripe height Si of FIGS. 2A–2B remains unchanged) while window depth Wd reduces.

Thereafter as planarization continues, the alignment mark is also planarized (e.g. between sample points 304–307) and the alignment mark's height starts falling. That is, in this particular embodiment, as the sample substrate is polished, the alignment mark's stripe height Si remains constant at 1.5 KÅ as the window depth Wd reduces from 17 KÅ to about 12 KÅ. Thereafter, the mark is polished, e.g. the stripe's height falls to 1.25 KÅ (see sample point 303) as the window's depth Wd falls to 11 KÅ. The alignment mark continues to be polished during further polishing of the substrate (see sample points 304–308).

Next, a curve G2 is drawn parallel to curve G1 but below curve G1, offset along the Y axis by 0.3 KÅ, thereby to show a relationship (between window depth and stripe height) for alignment mark 210, because alignment mark 210 does not have protective layer 201 (which is removed during the above-described step 5). As seen from curve G2, the alignment mark's stripe height remains unaffected while the window's depth reduces from 19 KÅ to 12.5 KÅ, i.e. between points 311 and 312. Therefore, to maintain the stripe height of alignment mark 210 at 1.2 KÅ, planarization of substrate 200 is stopped when the window's depth Wd reaches 12.5 KÅ. Any further planarization (that reduces the alignment mark's stripe height below 1.2 KÅ) is undesirable because the above-described ASM stepper requires an alignment mark to have a stripe height in the range of 1.2 KÅ±0.4 KÅ. Hence, the critical distance Cd (below which the window depth Wd should not be reduced) is determined to be 12.5 KÅ in this example. However, if a stepper requires an alignment with a smaller stripe height, the window depth can be proportionately reduced as would be obvious to the skilled artisan.

Figure 1A:
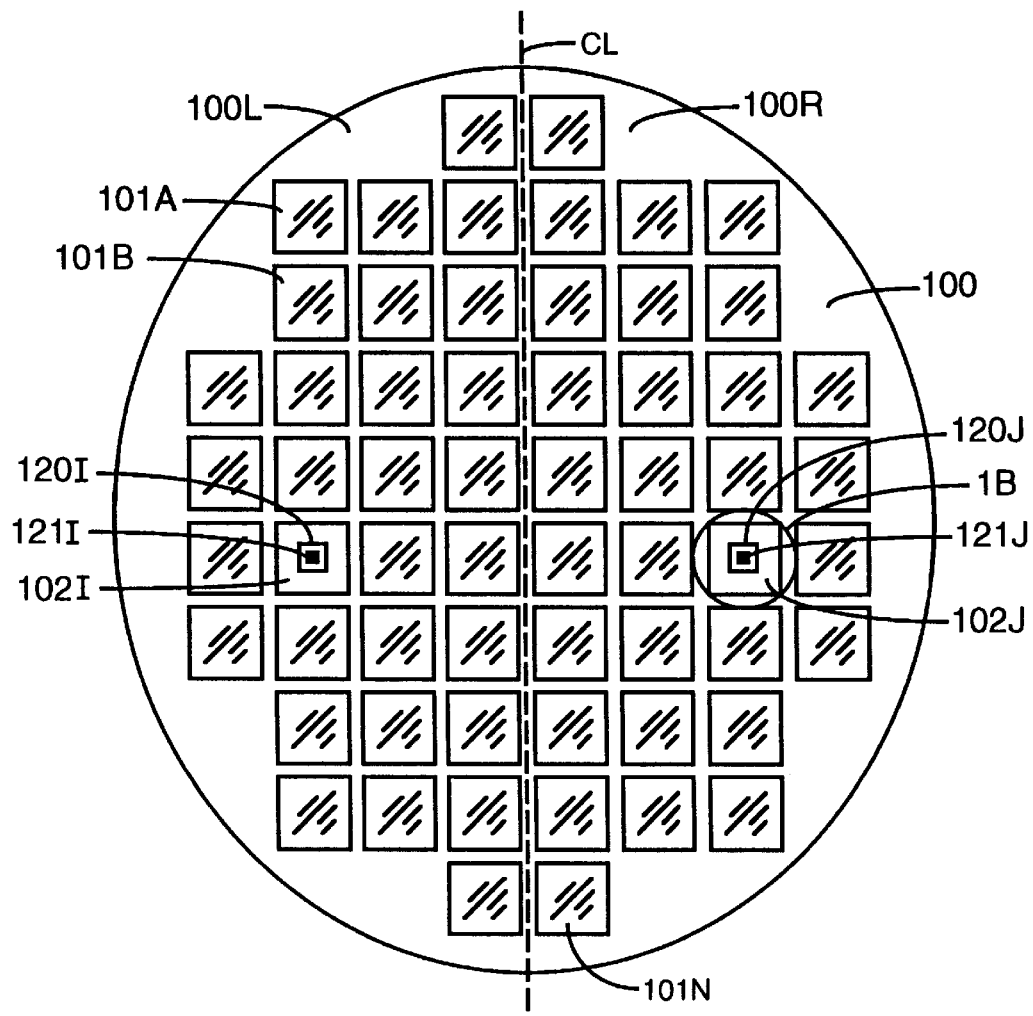
FIG. 1A illustrates in a top view, a semiconductor substrate of the prior art.
Figure 1B:
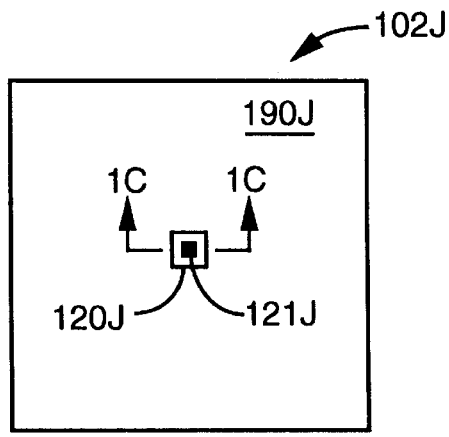
FIG. 1B illustrates in an enlarged view, a "field" containing an alignment mark in the semiconductor substrate of FIG. 1A.
Figure 1C:
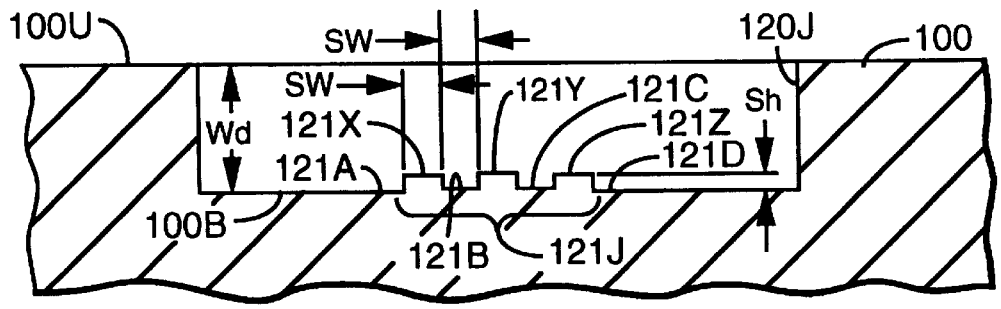
FIG. 1C illustrates, in a cross-sectional view, the alignment mark in the field of FIG. 1B.
Figure 1D:
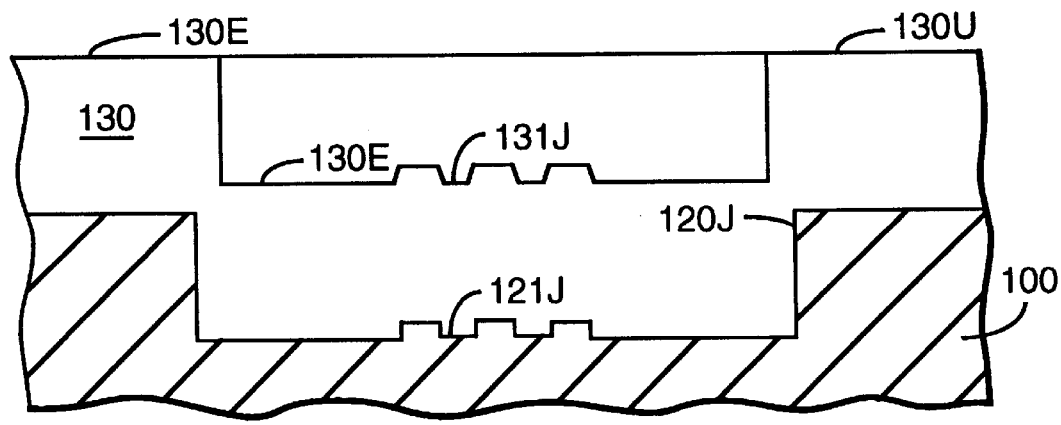
FIGS. 1D–1F illustrate in cross-sectional views three steps during processing of the semiconductor substrate of FIG. 1A.
Figure 1E:
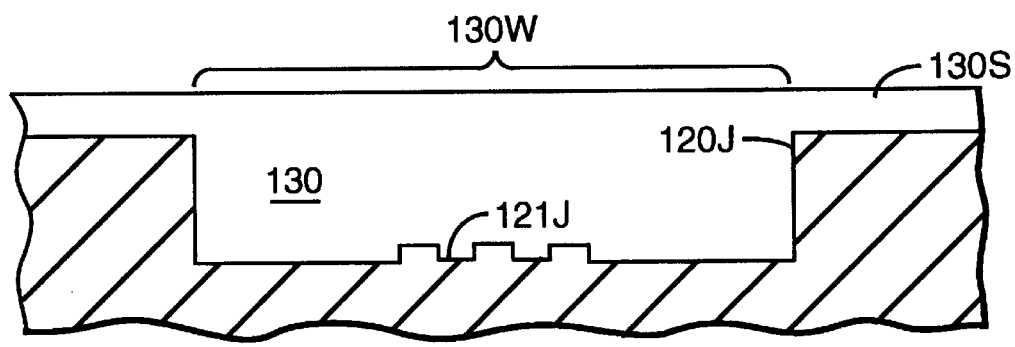
Figure 1F:
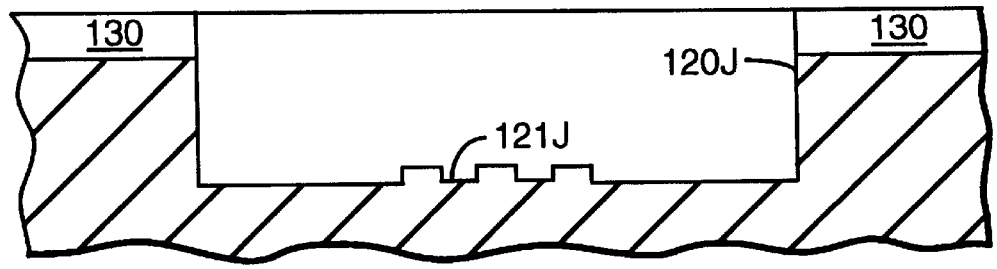

The above-described masking steps for the double CMP process are summarized in Table 1 below. As shown in Table 1, a layer (also called "masking layer") of photosensitive material that is used in one or more masking steps in active area 250 is also simultaneously used in window area 240 in two of these mask steps. As illustrated in Table 1, in this particular embodiment, a masking layer is used only in two types of areas: active areas 250 and window area 240. Therefore, this invention does not require the use of a masking layer for etching in a third type of area (called "drop-out area") 190J (FIG. 1B) that surrounds window 120J in field 102J. In contrast, U.S. Pat. No. 5,401,691 referenced above requires "removing layers . . . from drop-out area 306" as discussed above.

TABLE 1

| Use of a photosensitive layer (mask steps) to: | Active Areas 250 | Drop-out Area (See U.S. Pat. No. 5,401,691) | Window Area 240 |
| --- | --- | --- | --- |
| Grow field oxide layer (not shown) | Yes | No | No |
| Etch polysilicon 1 layer 221 | Yes | No | No |
| Open via in insulative layer 222 to expose polysilicon 1 layer 221 | Yes | No | No |
| Etch polysilicon 2 layer 223 | Yes | No | No |
| Open contact holes in insulative layer 224 to expose polysilicon 2 layer 223 | Yes | No | Yes |
| Etch metal 1 layer 225 | Yes | No | Yes |
| Open via in insulative layer 226 to expose metal 1 layer 225 | Yes | No | No |
| Etch metal 2 layer 227 | Yes | No | No |
| Open bond pads in protective layer 228 to expose metal 2 layer 227 | Yes | No | No |

A protective window as described herein can be used to maintain an alignment mark's stripe height (e.g. at 12 KÅ) throughout the entire processing of a semiconductor substrate, irrespective of the type of process. For example, in another method (hereinafter "triple CMP" method) requiring three steps of chemical mechanical polishing, body 299 (FIG. 4A) is processed by the above-described steps for the double CMP process (illustrated in FIGS. 2A–2I), followed by additional steps illustrated in FIGS. 4A–4D. Certain reference numerals in FIGS. 4A–4D are identical to reference numerals of similar features illustrated in FIGS. 2A–2I.

Figure 4C:
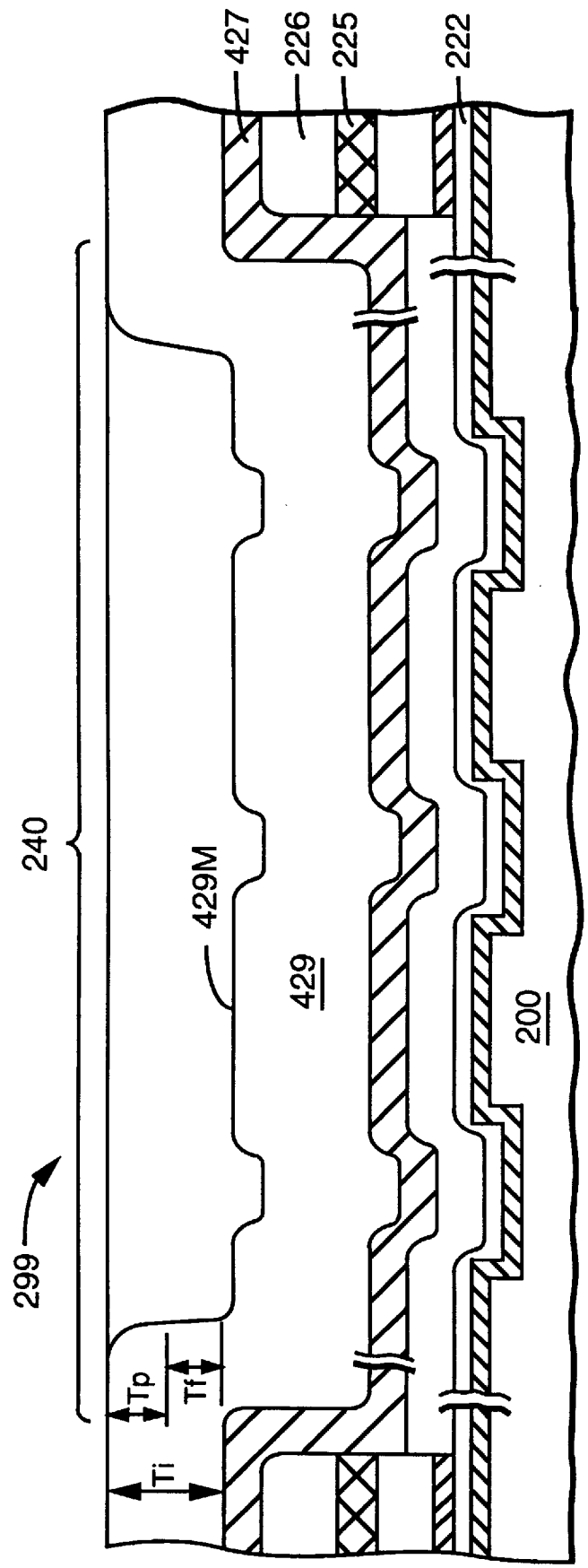
Figure 4D:
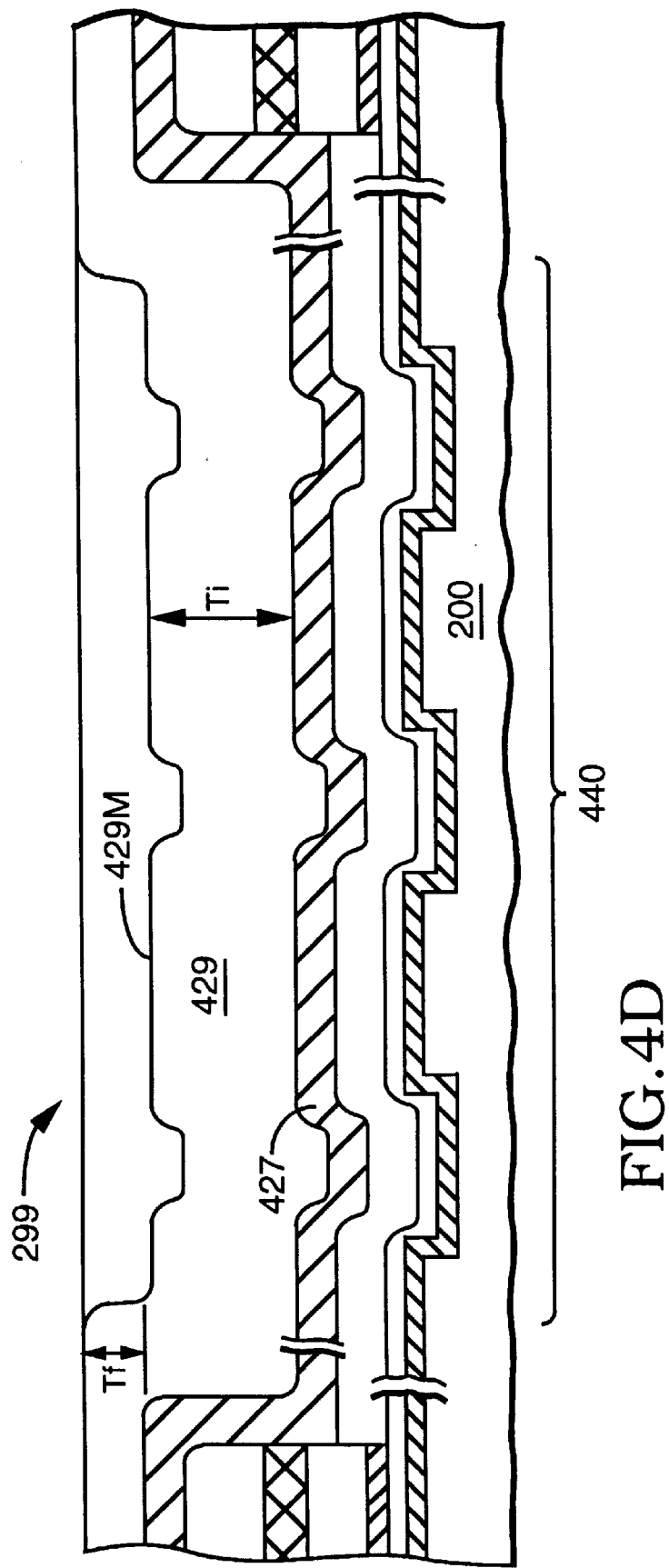

After the double CMP process is completed (FIG. 2J), insulative layer 226 is made thinner, for example by etching using an anisotropic etch, from a thickness of e.g. 2.7 μm to a thickness of e.g. 0.7 μm to form protective window 431 (FIG. 4A). Protective window 431 is formed simultaneously with the etching of via holes in insulative layer 226 over active areas (not shown in FIGS. 4A–4D) of a semiconductor substrate 200.

Thereafter, a metal 2 layer 427 (FIG. 4B) is formed over all areas of body 299, including window area 240 and active areas (not shown). Then, an insulative layer 429 (FIG. 4C) is formed over all areas of body 299 having an initial thickness Ti (FIG. 4C). Next, insulative layer 429 is planarized in a third planarization step, e.g. by chemical mechanical polishing. At the end of planarization, insulative layer 429 (FIG. 4D) has a thickness Tf in all areas other than window area 240. In window area 240, insulative layer 429 has thickness Ti, and alignment mark 429M remains untouched at the end of the third planarization step.

Therefore, an alignment mark's stripe height is maintained at a predetermined minimum height Smin (e.g. 12 KÅ) throughout all the steps of forming integrated circuit dice, by forming a sufficiently deep protective window prior to planarization, irrespective of the number of steps of planarization. Hence a method in accordance with the invention involves etching one or more layers prior to a planarization step so as to form a protective window having a depth sufficient to protect the alignment mark during the planarization step.

In yet another embodiment, a method (hereinafter "four CMP" method) has steps substantially identical to the above-described steps of the triple CMP method, and in addition includes a step of deepening yet another insulative layer (not shown) simultaneously with the step of opening via holes in that insulative layer (in the active areas). Steps using a masking layer in the triple CMP and four CMP methods are summarized in Table 2 below.

TABLE 2

| Use of a photosensitive layer to: | Active Areas 450 | Drop-out Area (See U.S. Pat. No. 5,401,691) | Window Area 440 |
| --- | --- | --- | --- |
| Grow field oxide layer | Yes | No | No |
| Etch polysilicon layer 221 | Yes | No | No |
| Open via in insulative layer 222 to expose polysilicon layer | Yes | No | No |
| Etch polysilicon 2 layer 223 | Yes | No | No |
| Open contact holes in insulative layer 224 to expose polysilicon 2 layer | Yes | No | Yes |
| Etch metal-1 layer 225 | Yes | No | Yes |
| Open via in insulative layer 226 to expose metal-1 layer | Yes | No | Yes |
| Etch metal-2 layer 227 | Yes | No | No |

TABLE 2-continued

| Use of a photosensitive layer to: | Active Areas 450 | Drop-out Area (See U.S. Pat. No. 5,401,691) | Window Area 440 |
|---|---|---|---|
| Open via in metal-2 layer 227 | Yes | No | No (Yes for four CMP) |
| Etch metal-3 layer | Yes | No | No |
| Open bond pads in protective layer 228 to expose metal-3 layer | Yes | No | No |

In the embodiment illustrated in Table 2, for a triple CMP or four CMP method, masking layers are used (for removing layers to expose an underlying alignment mark), only three times or four times respectively in window area 440, and are not used at all in drop-out areas, in contrast to the process of U.S. Pat. No. 5,401,691.

Therefore, in accordance with the invention, for a method requiring "N" steps of planarization masking layers are used "N" times to remove material from window area 240. Specifically, for each of the "N" steps of planarization, the masking layer is used for removing layers in a window area to expose an original or replicated alignment mark before planarization, except for the very first (i.e. initial) step of planarization. For the first planarization step, a base window is created (as described above) after planarization because the substrate is typically too shallow to allow formation of a protective window. Thus, in contrast to U.S. Pat. No. 5,401,691, this invention eliminates the step of etching a surface after planarization, other than for formation of a base window (e.g. other than etching of surface 224S in FIG. 2D).

According to the invention, the depth of a protective window after planarization is deliberately selected to be at least equal to the critical distance Cd and thereby avoid destruction of an alignment mark inside the protective window. Steps required for fabrication of integrated circuits not described herein are well known to the person skilled in the art, as seen from, for example, U.S. Pat. No. 5,401,691.

Although certain specific details, such as specific process steps and materials have been described herein for certain embodiments of the invention, other embodiments of the invention will be obvious to the skilled artisan, in view of the enclosed disclosure. For example prior to formation of a polysilicon layer, a thin layer of oxide (also referred to as "gate oxide") having a thickness of approximately 200 Å (not shown) can be formed.

Numerous other modifications and variations of the above described embodiments are encompassed by the attached claims.

I claim:

1. A method of processing a body, said body including a first layer having a first area and a second layer having a second area, said first layer having an alignment mark in said first area, said method comprising:

forming a third layer over said first layer and over said second layer, said third layer covering said alignment mark;

removing at least a portion of said first layer in said first area to create a preventive window;

forming a fourth layer in said first area and in said second area, a replicated alignment mark being formed on said fourth layer by replication of said alignment mark in said first area; and planarizing said fourth layer to remove a thickness of said body in all areas other than said first area, said thickness being sufficiently smaller than said depth so as to maintain said replicated alignment mark intact at the end of planarization.

2. The method of claim 1 wherein said depth is larger than a minimum height of said base alignment mark required for recognition by a stepper used in said method.

3. The method of claim 1 wherein each of said removing and said planarizing are performed N times, while said said replicated alignment mark is maintained intact each time at the end of planarization.

4. A method of processing a body, said body having a first area and a second area, said method comprising:

forming a base mark in said first area;

forming a first layer in said first area and in said second area, a first replicated mark being formed on said first layer in said first area by replication of said base mark;

forming a second layer over said first layer in said&first area and over said first layer in said second area;

removing at least a portion of said second layer in said first area thereby to create a base window and expose said first replicated mark at the bottom of said base window;

forming a third layer over said first layer in said first area and over said second layer in said second area;

removing at least a portion of said third layer in said first area thereby to create a preventive window by deepening said base window, said third layer being unplanarized;

forming a fourth layer in said first area and in said second area, a fourth replicated mark being formed on said fourth layer in said first area; and planarizing said body while maintaining said fourth replicated mark intact until the end of planarization.

5. The method of claim 4 further comprising removing a portion of said first layer in said first area after removing said third layer portion to expose said base mark at a bottom surface of said preventive window.

6. The method of claim 4 wherein a second replicated mark is created on said second layer in said first area by replication of said first replicated mark, said method further comprising:

planarizing said second layer prior to creation of said base window, said planarization destroying said second replicated mark.

7. The method of claim 4 wherein said forming a base mark includes forming a base layer over an original mark created in said first area, said base mark being created on said base layer by replication of said original mark.

8. The method of claim 4 wherein said planarizing comprises chemical mechanical polishing of said fourth layer and said fourth replicated mark remains untouched by said chemical mechanical polishing.

9. A method for maintaining a mark on a silicon substrate, said silicon substrate having a window area and a plurality of active areas around said window area, said method comprising:

forming a base mark in said window area;

depositing a polysilicon layer over said window area and over said plurality of active areas, said polysilicon layer having an upper surface and a lower surface, said upper surface being exposed, wherein a replicated mark is formed on said upper surface by replication of said base mark;

growing an oxide layer over said window area and over said active areas;

planarizing said oxide layer by chemical mechanical polishing to form a flat planarized surface;

etching said first planarized surface such that said oxide layer is removed from said window area to expose said replicated mark;

depositing a first metal layer over said polysilicon layer in said window area and over said oxide layer in said active areas;

etching said first metal layer such that said first metal layer is removed from said window area and remains over at least a portion of one of said active areas;

etching said polysilicon layer such that said polysilicon layer is removed from said window area to expose a base mark formed underneath said polysilicon layer, said polysilicon layer being unplanarized;

depositing a second oxide layer over said window area and over said plurality of active areas, a replicated alignment mark being formed on an exposed surface of said second oxide layer;

planarizing said second oxide layer by chemical mechanical polishing such that said replicated alignment mark remains intact at the end of planarization.

10. The method of claim 9 being devoid of etching a planarized surface in said window area other than etching said first planarized surface.

11. The method of claim 1 wherein:

said replicated alignment mark is located at said depth measured perpendicular to an exposed surface of said fourth layer in said second area.

12. A method of processing a body so as to preserve an alignment mark on an exposed surface of said body, said body having a first area and a second area, said body having an alignment mark at the bottom of a base window in said first area, said method comprising:

forming a first layer in said base window over said alignment mark;

removing at least a portion of said first layer in said first area thereby to deepen, said base window;

forming a second layer in said first area and in said second area, a replicated alignment mark being formed on said second layer by replication of said alignment mark in said first area; and planarizing said second layer to remove a thickness of said body in all areas other than said first area while maintaining said replicated alignment mark intact until the end of planarization.

13. The method of claim 12 wherein:

said replicated alignment mark is located at said depth measured perpendicular to an exposed surface of said second layer in said second area.

14. The method of claim 12 wherein:

the second layer is a dielectric layer; and the planarizing includes chemical-mechanical-polishing of the dielectric layer.

15. The method of claim 12 wherein:

during said removing said window is deepened to a depth, said depth being sufficiently larger than said thickness removed during planarizing so as to maintain said second replicated alignment mark intact.

* * * * *